(12) United States Patent
Geaghan

(10) Patent No.: US 7,830,158 B2
(45) Date of Patent: Nov. 9, 2010

(54) TIME-SLOPED CAPACITANCE MEASURING CIRCUITS AND METHODS

(75) Inventor: Bernard O. Geaghan, Salem, NH (US)

(73) Assignee: 3M Innovative Properties Company, Saint Paul, MN (US)

( * ) Notice: Subject to any disclaimer, the term of this patent is extended or adjusted under 35 U.S.C. 154(b) by 441 days.

(21) Appl. No.: 12/027,852

(22) Filed: Feb. 7, 2008

(65) Prior Publication Data

US 2009/0167326 A1 Jul. 2, 2009

Related U.S. Application Data

(60) Provisional application No. 61/017,451, filed on Dec. 28, 2007.

(51) Int. Cl.
*G01R 27/26* (2006.01)

(52) U.S. Cl. ...................... 324/678; 324/684

(58) Field of Classification Search ............ 324/678, 324/676, 658, 649, 600, 684, 686, 669, 675; 345/173, 156
See application file for complete search history.

(56) References Cited

U.S. PATENT DOCUMENTS

| | | | |
|---|---|---|---|
| 4,887,024 A * | 12/1989 | Sugiyama et al. ........... 324/674 |
| 4,954,823 A | 9/1990 | Binstead |
| 5,136,251 A | 8/1992 | George et al. |
| 5,374,787 A | 12/1994 | Miller et al. |
| 5,461,321 A * | 10/1995 | Sanders et al. .............. 324/678 |
| 5,650,597 A | 7/1997 | Redmayne |
| 5,861,583 A | 1/1999 | Schediwy et al. |
| 5,926,409 A | 7/1999 | Engh et al. |
| 6,239,389 B1 | 5/2001 | Allen et al. |
| 6,275,047 B1 | 8/2001 | Zoellick |
| 6,356,086 B1 | 3/2002 | Cook et al. |
| 6,466,036 B1 | 10/2002 | Philipp |
| 6,516,672 B2 * | 2/2003 | Wang .......................... 73/718 |
| 6,529,017 B2 | 3/2003 | Martin et al. |
| 6,961,015 B2 | 11/2005 | Kernahan et al. |
| 7,148,697 B2 | 12/2006 | Doljack |
| 7,254,775 B2 | 8/2007 | Geaghan et al. |
| 7,260,796 B2 * | 8/2007 | Suaya et al. .................... 716/4 |
| 7,380,891 B2 | 6/2008 | Ohashi et al. |
| 2002/0008526 A1 | 1/2002 | Martin et al. |
| 2002/0116696 A1 * | 8/2002 | Suaya et al. .................... 716/6 |
| 2004/0255674 A1 * | 12/2004 | Steiger et al. ............ 73/514.32 |
| 2005/0268260 A1 * | 12/2005 | Suaya et al. .................... 716/5 |
| 2007/0074913 A1 | 4/2007 | Geaghan |
| 2007/0107492 A1 * | 5/2007 | Lasalandra et al. ........... 73/1.88 |
| 2007/0143059 A1 | 6/2007 | Moser |
| 2008/0142281 A1 | 6/2008 | Geaghan |
| 2008/0252608 A1 | 10/2008 | Geaghan |

OTHER PUBLICATIONS

U.S. Appl. No. 11/612,799, filed Dec. 19, 2006, entitled "Touch Sensor with Electrode Array".
U.S. Appl. No. 61/017,451, filed Dec. 28, 2007, entitled, "Multiple Capacitance Measuring Circuits and Methods".

* cited by examiner

*Primary Examiner*—Hoai-An D Nguyen
(74) *Attorney, Agent, or Firm*—Steven A. Bern

(57) ABSTRACT

Time-sloped capacitance measuring circuits use the time to ramp voltage signals between reference levels to determine an unknown capacitance, where the ramping time is determined by the cumulative whole number of clock cycles counted during voltage signal ramping over multiple ramp cycles. Measurement resolution can be improved by adjusting a starting voltage level for subsequent voltage signal ramps by an amount that compensates for incremental voltage ramping during a terminal clock cycle of a previous voltage signal ramp.

26 Claims, 7 Drawing Sheets

TIME-SLOPED CAPACITANCE MEASURING CIRCUITS AND METHODS

This patent document claims the benefit, under 35 U.S.C. §119(e), of U.S. Provisional Patent Application No. 61/017,451, entitled "Multiple Capacitance Measuring Circuits and Methods" as was filed on Dec. 28, 2007, which document is fully incorporated herein.

The present invention relates generally to circuits and methods for measuring capacitances in a time-sloped manner over multiple signal ramps, and in particular to adjusting subsequent signal ramps to account for residual signals from previous signal ramps.

BACKGROUND

Touch sensitive devices allow a user to conveniently interface with electronic systems and displays by reducing or eliminating the need for mechanical buttons, keypads, keyboards, and pointing devices. For example, a user can carry out a complicated sequence of instructions by simply touching an on-display touch screen at a location identified by an icon. In many touch sensitive devices, the input is sensed when a conductive object in the sensor is capacitively coupled to a conductive touch implement such as a user's finger. Such devices measure capacitance at multiple locations due to the touch disturbance, and use the measured capacitances to determine touch position.

SUMMARY OF THE INVENTION

In certain embodiments, the present invention provides methods for use in a device that measures capacitance of an electrode by applying electrical charge to the electrode to ramp voltage signals between first and second reference voltage levels over multiple ramp cycles initiated in synchronization with clock cycles, the capacitance being proportionate to the cumulative whole number of clock cycles counted during voltage signal ramping over the multiple ramp cycles. Such methods include, upon reaching one of the reference voltages during a present ramp cycle at a time t1 during a terminal clock cycle, adjusting a starting voltage level for a subsequent ramp cycle by an amount to compensate for incremental voltage ramping that occurs from the time t1 to the end of the terminal clock cycle, and adjusting the number of clock cycles counted during the present ramp cycle depending on the adjusted starting voltage of the subsequent ramp cycle.

In certain embodiments, the present invention provides devices that measure capacitance of an electrode by applying electrical charge to the electrode to ramp voltage signals between first and second reference voltage levels over multiple ramp cycles initiated in synchronization with clock cycles, the capacitance being proportionate to the cumulative whole number of clock cycles counted during voltage signal ramping over the multiple ramp cycles. Such devices include a ramp control circuit that, responsive to reaching one of the reference voltages during a present ramp cycle at a time t1 during a terminal clock cycle, adjusts a starting voltage level for a subsequent ramp cycle relative to one of the first and second reference voltage levels by an amount that compensates for incremental voltage ramping that occurs during the present ramp cycle from the time t1 to the end of the terminal clock cycle, and a counter control circuit that adjusts the number of clock cycles counted during the present ramp cycle depending on the adjusted starting voltage of the subsequent ramp cycle.

In certain embodiments, the present invention provides devices that measure capacitance at a plurality of locations by applying electrical charge to each location to ramp respective voltage signals between first and second reference voltage levels over multiple ramp cycles initiated in synchronization with clock cycles, the capacitance at each location being proportionate to the cumulative whole number of clock cycles counted during respective voltage signal ramping over the multiple ramp cycles. Such devices include a ramp control circuit associated with each of the plurality of locations to control ramping of the respective voltage signal, each ramp control circuit operable to adjust a starting voltage level for a subsequent ramp cycle of the respective voltage signal relative to one of the first and second reference voltage levels by an amount that compensates for incremental voltage ramping of the respective voltage signal during a terminal clock cycle of a previous ramp cycle, and a counter control circuit that adjusts the number of clock cycles counted during the previous ramp cycle depending on the adjusted starting voltage of the subsequent ramp cycle.

In certain embodiments, the present invention provides methods for increasing capacitance measurement resolution for use in a device for measuring capacitance of an electrode by applying electrical charge to the electrode to ramp a voltage signal between first and second reference voltage levels over multiple ramp cycles initiated in synchronization with clock cycles, the capacitance being proportionate to the cumulative whole number of clock cycles counted during voltage signal ramping over the multiple ramp cycles. Such methods include adjusting a starting voltage level for a subsequent voltage signal ramp cycle relative to one of the first and second reference voltage levels by an amount that compensates for incremental voltage ramping during a terminal clock cycle of a previous voltage signal ramp cycle.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

The present disclosure may be more completely understood and appreciated in consideration of the following detailed description of various embodiments in connection with the accompanying drawings, in which.

Figure 1A:
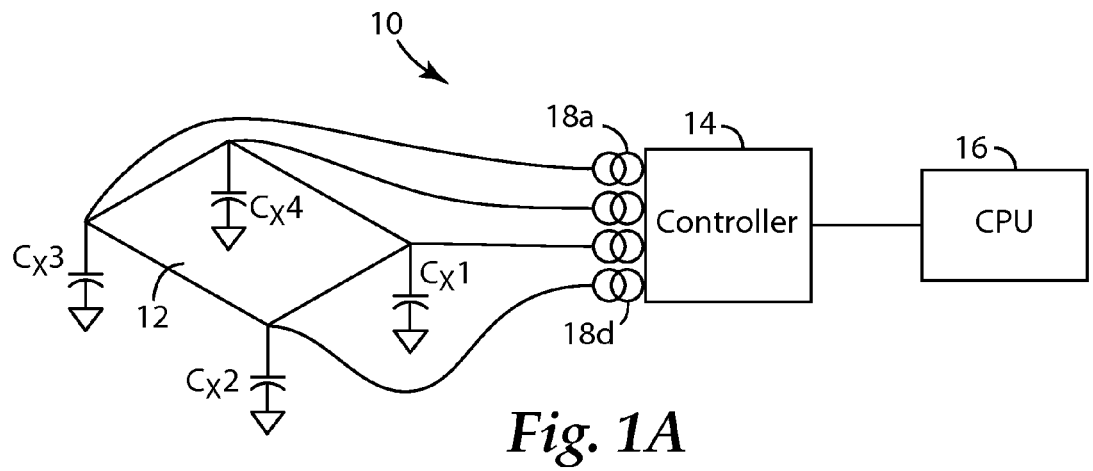
FIGS. 1A through 1C schematically show exemplary touch sensor systems useful in certain embodiments of the present invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description of the illustrated embodiments, reference is made to the accompanying drawings which form a part hereof, and in which is shown by way of illustration, various embodiments in which the invention may be practiced. It is to be understood that the embodiments may be utilized and structural changes may be made without departing from the scope of the present invention.

In certain embodiments, the present disclosure is directed to measuring capacitance of an electrode by ramping voltage signals between reference voltage levels over multiple ramp cycles and counting the number of clock cycles accumulated during voltage signal ramping over the multiple ramp cycles. In general, an individual voltage signal ramp will reach its threshold level (e.g., one of the voltage reference levels) during a clock cycle, at the end of which the ramp cycle ends (and as such, the clock cycle during which the voltage threshold is reached can be called the "terminal clock cycle" for that ramp). Rather than starting a subsequent (e.g., next) voltage signal ramp from the voltage threshold (or other designated reference level), the starting voltage level for the subsequent ramp is adjusted to compensate for incremental voltage ramping that occurred between reaching the threshold and the end of the terminal clock cycle. Depending on how the subsequent starting voltage level is adjusted, adjustments may be made the number of clock cycles counted during the just-completed ramp cycle. For example, adjusting the number of counted clock cycles can involve determining whether to count the terminal clock cycle.

In certain embodiments, adjusting the starting voltage level of subsequent ramp cycles has the effect of shifting residual uncounted time (i.e., a fraction of a clock cycle) from one ramp cycle to another. Thus, rather than merely truncating the residual time (by rounding up to the next full clock cycle or down to the last full clock cycle) and then starting over at the next ramp, adjusting the starting voltage level of a subsequent ramp allows the traversal of the residual time to be counted either in the just-completed ramp cycle or in a subsequent ramp cycle. For example, in certain embodiments, the full terminal clock cycle can be counted in a ramp cycle under conditions in which the ramp is reversed during the residual time between reaching the threshold and the end of the terminal clock cycle. By reversing the ramp during this residual time, the residual time is in essence "borrowed" from the subsequent ramp cycle. In other embodiments, the terminal clock cycle is not counted, and the residual time is carried over into the subsequent ramp cycle by adjusting the starting voltage level accordingly.

Such shifting of residual uncounted time can be particularly useful under conditions where the voltage signal ramps are relatively fast when compared to the clock. For example, when capacitances to be measured are small (e.g., such as can be encountered in capacitive touch sensor devices), only a few clock cycles may be needed for a ramp cycle to reach its threshold (e.g., 5 to 50 clock cycles). Under such circumstances, the resolution of the capacitance measurement is limited by the clock because the capacitance measurement is based on the whole number of counted clock cycles. Shifting the residual time allows accounting for the otherwise uncounted fractions of clock time, resulting in potentially increased measurement resolution.

Without loss of generality, and for the purpose of efficient illustration, it is useful to describe various aspects of the present invention in terms of touch sensor system environments. It will be recognized, however, that such descriptions are merely exemplary and not limiting, and that aspects of the present invention can be suitably implemented in many applications where capacitances are measured, and where relative magnitudes or ratios of measured capacitances are calculated. Examples include instruments, pressure gauges, and measurement of small distances, areas, and moisture.

Figure 1B:
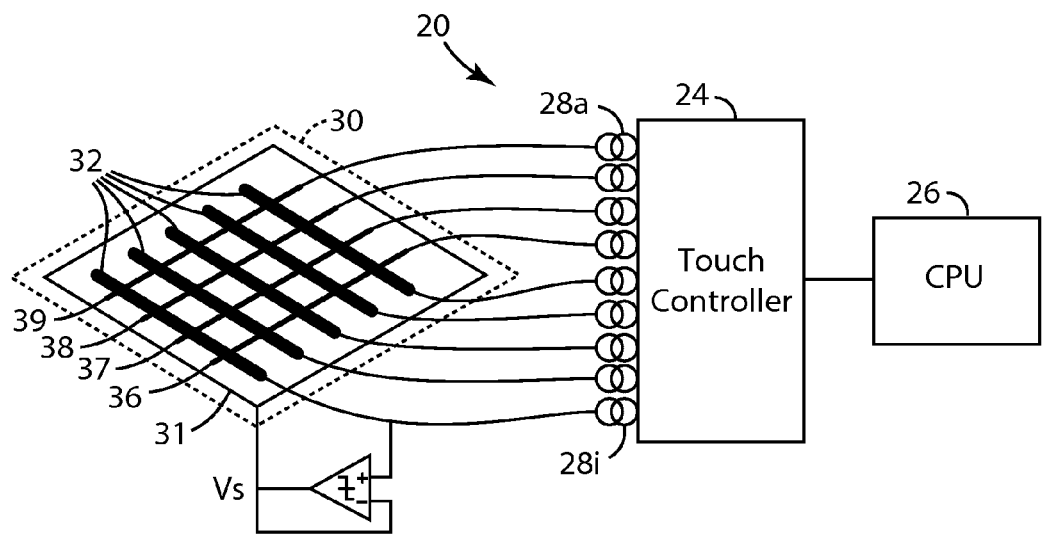
Figure 1C:
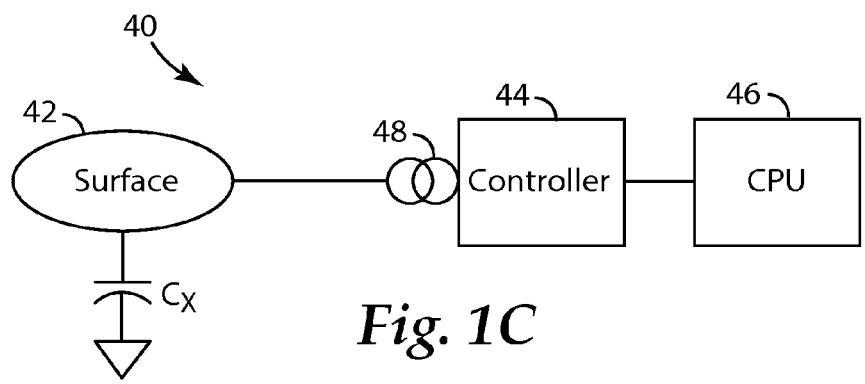

FIGS. 1A through 1C illustrate touch sensor examples of capacitance measurement devices suitable for implementing various embodiments of the present invention. In certain applications, the devices shown determine information related to a touch object coupled to a sensor surface by measuring capacitance, or relative capacitance, at one or more locations on the sensor surface due to the presence of the touch object. For example, device 10 in FIG. 1A represents a 4-wire capacitive sensor system (also called analog capacitive) in which capacitances $C_x1$ through $C_x4$, shown located at the corners of sensor 12, are measured by controller 14. Sensor 12 can be a continuous resistive layer (such as the capacitive touch sensors commercially available from 3M Touch Systems, Inc. under the trade designation Cleartek), a patterned or segmented resistive layer (such as sensors disclosed in co-assigned U.S. Ser. No. 11/734,553, filed on Apr. 12, 2007, which is hereby fully incorporated into this document), or any other suitable sensor. As another example, device 20 in FIG. 1B represents a matrix capacitive sensor system that includes orthogonal sets of electrodes, and a controller 24 that measures the capacitance on each of the electrodes (such as disclosed in U.S. Pat. Publication 2007/0074913, which is hereby fully incorporated into this document). Embodiments of the present invention can also be used to measure capacitance for button and switch applications (individually or in an array), for linear slider controls, and so forth. For example, device 30 in FIG. 1C represents a capacitive button sensor system 30 that includes a sensing surface 32 and a controller 34 that measures the capacitance of the sensor surface.

As indicated, system 10 in FIG. 1A shows a 4-wire touch embodiment, including a touch controller 14 coupled to a microprocessor 16 and to an analog capacitive sensor 12. In exemplary embodiments, controller 14 performs functions such as touch signal conditioning, data conversion, and real-time processing, while microprocessor 16 performs functions such as filtering and touch coordinate calculation. Controller 14 drives sensor 12 at the capacitance measurement locations using current sources 18a through 18d. When a conductive touch object is coupled to sensor 12, the resulting capacitance is measured at each corner, represented by lumped capacitances $C_x1$ through $C_x4$. For ease of illustration, exemplary embodiments are described herein in terms of current drive circuits. However, one of skill in the art will recognize that the present invention is equally applicable to voltage drive circuits such as those disclosed in commonly-assigned U.S. Ser. No. 11/612,790, filed on Dec. 19, 2006, which is hereby fully incorporated into this document.

As indicated, system 20 in FIG. 1B shows a matrix touch sensor embodiment, including a touch controller 24 coupled to a microprocessor 26 and to matrix capacitive sensor 30. In exemplary embodiments, controller 24 performs functions such as touch signal conditioning, data conversion, and real-time processing, while microprocessor 26 performs functions such as filtering and touch coordinate calculation. As shown in FIG. 1B for the purposes of illustration, controller 24 drives sensor 30 via nine current sources 28a through 28i, each current source coupled to a different sensing electrode. The electrodes are arranged as orthogonal sets of linear bars, including bottom electrodes 32 and top electrodes 36 through 39. A parasitic capacitance (not indicated) couples bottom electrodes 32 to ground and top electrodes 36 through 39 to ground. There can also be a mutual capacitance (not indicated) that couples each of bottom electrodes 32 to adjacent bottom electrodes, and each of bottom electrodes 32 to each of top electrodes 36 through 39. In certain embodiments, sensor 30 includes an electrically conductive shield 31 to mitigate currents that might otherwise flow due to parasitic capacitances. Shield 30 may be connected to a fixed voltage (not indicated) or it may be driven with an AC electrical signal Vs, which can for example be equal to the voltage signals applied to electrodes 32. Reducing the AC voltage difference between shield 31 and electrodes 32, and between shield 31 and electrodes 36 through 39, reduces capacitive currents that may flow through mutual (parasitic) capacitances. This is desirable because parasitic capacitance tends to reduce sensitivity to changes in touch capacitance.

As indicated, system 40 in FIG. 1C shows a capacitive button embodiment, including a touch controller 44 coupled to a microprocessor 46 and to a sensor surface 42. In exemplary embodiments, controller 44 performs functions such as touch signal conditioning, data conversion, and real-time processing, while microprocessor 46 performs functions such as filtering and touch coordinate calculation. Controller 44 drives sensor surface 42 using current source 48. When a conductive touch object is coupled to sensor 42, the resulting capacitance $C_x$ is measured. As noted above, system 40 can be implemented using the current drive circuit shown as well as using voltage drive circuits.

Figure 2A:
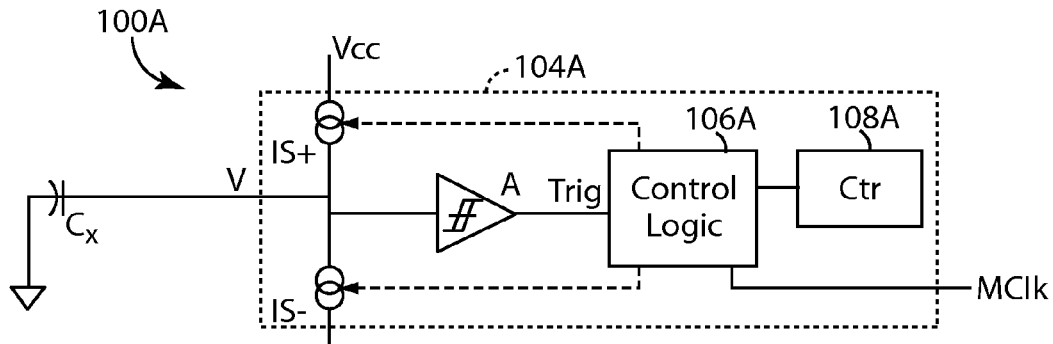
FIGS. 2A and 2B schematically show portions of exemplary control circuits useful in certain embodiments of the present invention FIG. 3 schematically shows an exemplary control circuit useful in certain embodiments of the present invention.
Figure 2B:
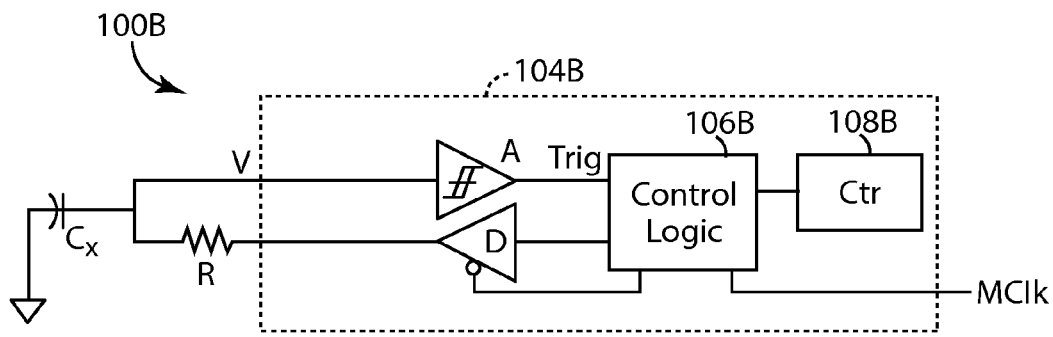

FIGS. 2A and 2B show exemplary current drive circuits 100A and 100B, which can be used to drive one or more electrodes on sensor surfaces and/or one or more measurement locations on an electrode of a sensor surface. In FIG. 2A, timed-slope converter 104A generates positive and negative voltage ramp signals by alternately injecting positive and negative currents from current sources IS+ and IS− into capacitance $C_x$. Timed-slope converter 104A includes a comparator A that provides a trigger Trig to control logic 106A when a high threshold is reached during a voltage ramp using IS+, or when a low threshold is reached during a voltage ramp using IS−. When measuring the capacitance $C_x$, the accumulated ramp times for the voltage signals V to ramp up and down between high and low thresholds are measured concurrently over an integration period by counting the total number of main clock cycles (MClk) that occur during ramping. The counter 108A (also denoted Ctr) increments the MClk counts. The low and high voltage thresholds (denoted herein −Vth and +Vth) are the switching points of hysteresis comparator A (Schmitt trigger). Ramp signal V is generated by alternately turning on forward and reverse current generators IS+ and IS− at a desired rate. When IS+ is on, a constant current flows into $C_x$, generating an increasing voltage signal ramp. The ramp up, ramp down cycle is repeated a desired number of times depending on required measurement resolution, response times, and so forth.

FIG. 2B shows another exemplary drive circuit 100B that includes a time-slope converter 104B that has a comparator A providing a trigger signal Trig to control logic 106B that regulates stopping and starting of a counter 108B, much like the converter 104A shown in FIG. 2A. Drive circuit 100B additionally includes a tri-state driver D and a resistor R, which replace the current sources IS+ and IS− shown in the converter 104A of FIG. 2A, to generate currents into capacitor $C_x$. Circuit 100B can be used without analog current sources in the controller.

Figure 3:
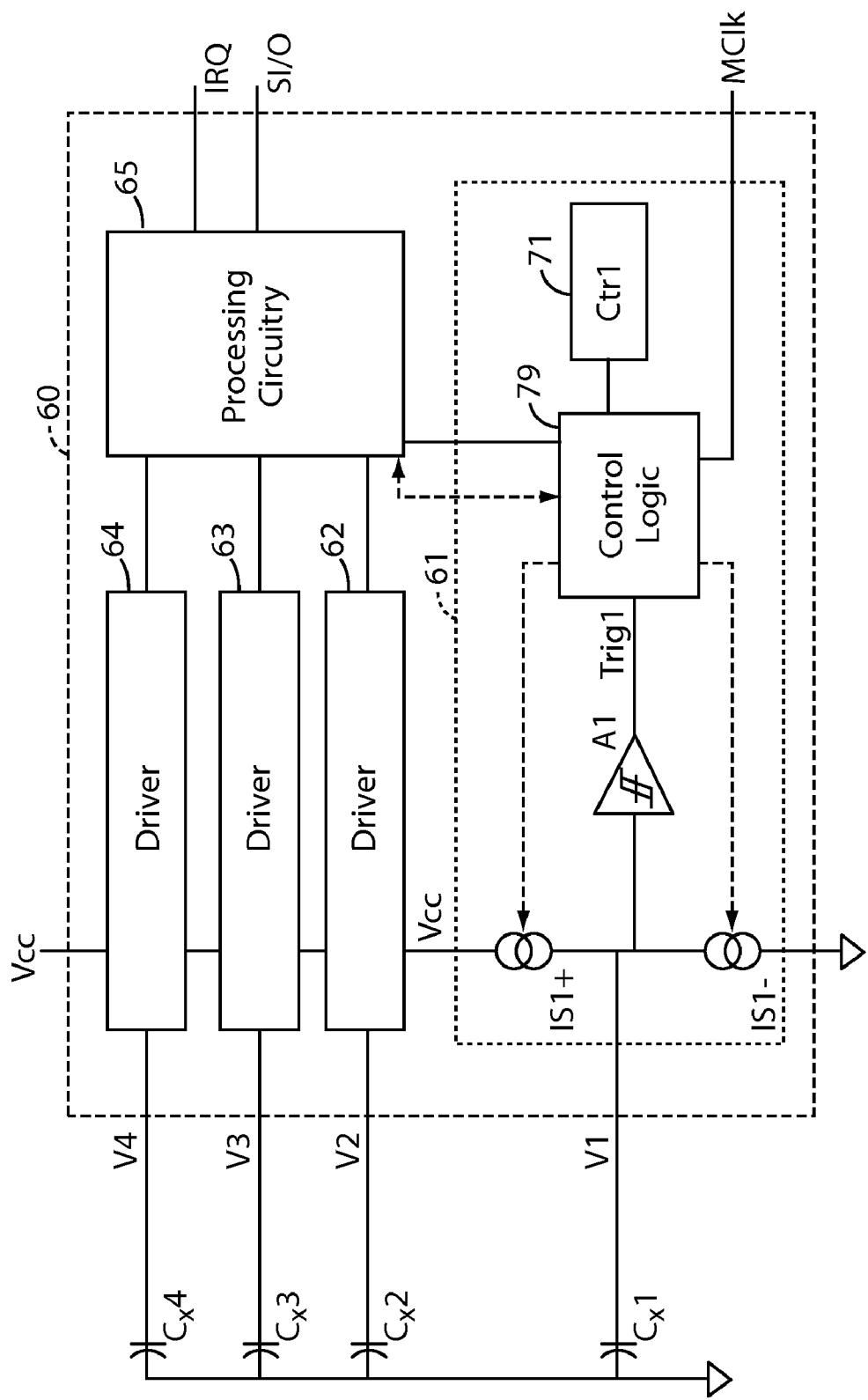

FIG. 3 exemplifies a controller 60 having four drive circuits 61 through 64, which are respectively used to measure capacitances $C_x1$ through $C_x4$, for example at different locations on a sensor surface of a 4-wire analog capacitive touch sensor. As shown, drive circuits 61 through 64 are each timed-slope analog-to-digital converters similar to the converter 104A shown in FIG. 2A. It will be appreciated that converters such as shown in FIG. 2B can be used, as well as voltage drive circuits. Although only timed-slope converter 61 is shown in detail in FIG. 3, it will be appreciated that each of timed-slope converters 62, 63 and 64 include corresponding components. In the general case, separate measurement channels are used for each capacitance measurement location, which in the case of a matrix touch sensor may be equivalent to the number of individual electrodes (e.g., sixteen measurement locations for an eight-by-eight electrode matrix).

The timed-slope converters are somewhat similar to dual-slope converters, each converter configured to generate forward (+) and reverse (−) ramp signals by alternately injecting forward direction and reverse direction currents from current sources into capacitances $C_x1$ through $C_x4$. For example, timed-slope converter 61 includes current sources IS1+ and IS1− (and, although not indicated, by consistent nomenclature, timed-slope converter 62 includes current sources IS2+ and IS2−, timed-slope converter 63 includes current sources IS3+ and IS3−, and timed-slope converter 64 includes current sources IS4+ and IS4−, with IS+ and IS− being used herein to indicate any or all of the current sources as indicated by context). In exemplary embodiments, the current sources are equal in magnitude so that IS1+=IS1−=IS2+=IS2−=IS3+=IS3−=IS4+=IS4−. Time-slope converter 61 also includes a comparator A1 that provides a trigger Trig1 to control logic 79 when a high threshold is reached during a voltage ramp using IS1+, or when a low threshold is reached during a voltage ramp using IS1−. Similarly, timed-slope converter 62 includes a comparator A2 that provides a trigger Trig2, and so forth.

Assuming that the measured capacitances are also equal, that is $C_x1=C_x2=C_x3=C_x4$, then the voltage signals V1, V2, V3, and V4 will have ramps of equal slope. For analog capacitive touch panel applications, $C_x1$ through $C_x4$ are typically close in value (for example, within about 30% of one another). A touch input to the sensor generally will have the effect of increasing one (or more) of the capacitances relative to the others, resulting in a slower ramp on the voltage signal of the channel having the greater capacitance. Differences in slopes result in differences in time required to ramp to a threshold voltage level (for example up from a low reference level such as ⅓ Vcc, or down from a high reference level such as ⅔ Vcc). The accumulated ramp times for the voltage signals V1 through V4 are measured concurrently over an integration period, and the measured differences between the accumulated ramp times are used to indicate the differences in capacitance among $C_x1$ through $C_x4$. For time-slope converter 61, the counter 71 (also denoted Ctr1) increments a count for every MClk cycle, thus accumulating the ramping time. The low and high voltage thresholds (denoted herein −Vth and +Vth) are the switching points of hysteresis comparators A1 through A4 (only A1 shown in FIG. 3).

Ramp signals V1 through V4 are generated by alternately turning on forward and reverse current generators, such as IS1+ and IS1−, at a desired rate. With reference to converter 61, when IS1+ is on, a constant current flows into $C_x1$, generating an increasing voltage signal ramp. Unless prematurely terminated, the V1 signal will ramp up until comparator A1 triggers at +Vth. At that point, IS1+ turns off. A voltage signal ramp down then occurs when source IS1− turns on, and can continue until comparator A1 is triggered at threshold −Vth. The ramp up, ramp down cycle is repeated a desired number of times depending on required measurement resolution, response times, and so forth. Each of the timed-slope converters is connected to circuitry 65 that can include the integration counter or other counters that control all of the channels, as well as serial I/O ports (SI/O) and an interrupt request port (IRQ) coupled to a microprocessor (not shown), for example.

Figure 4A:
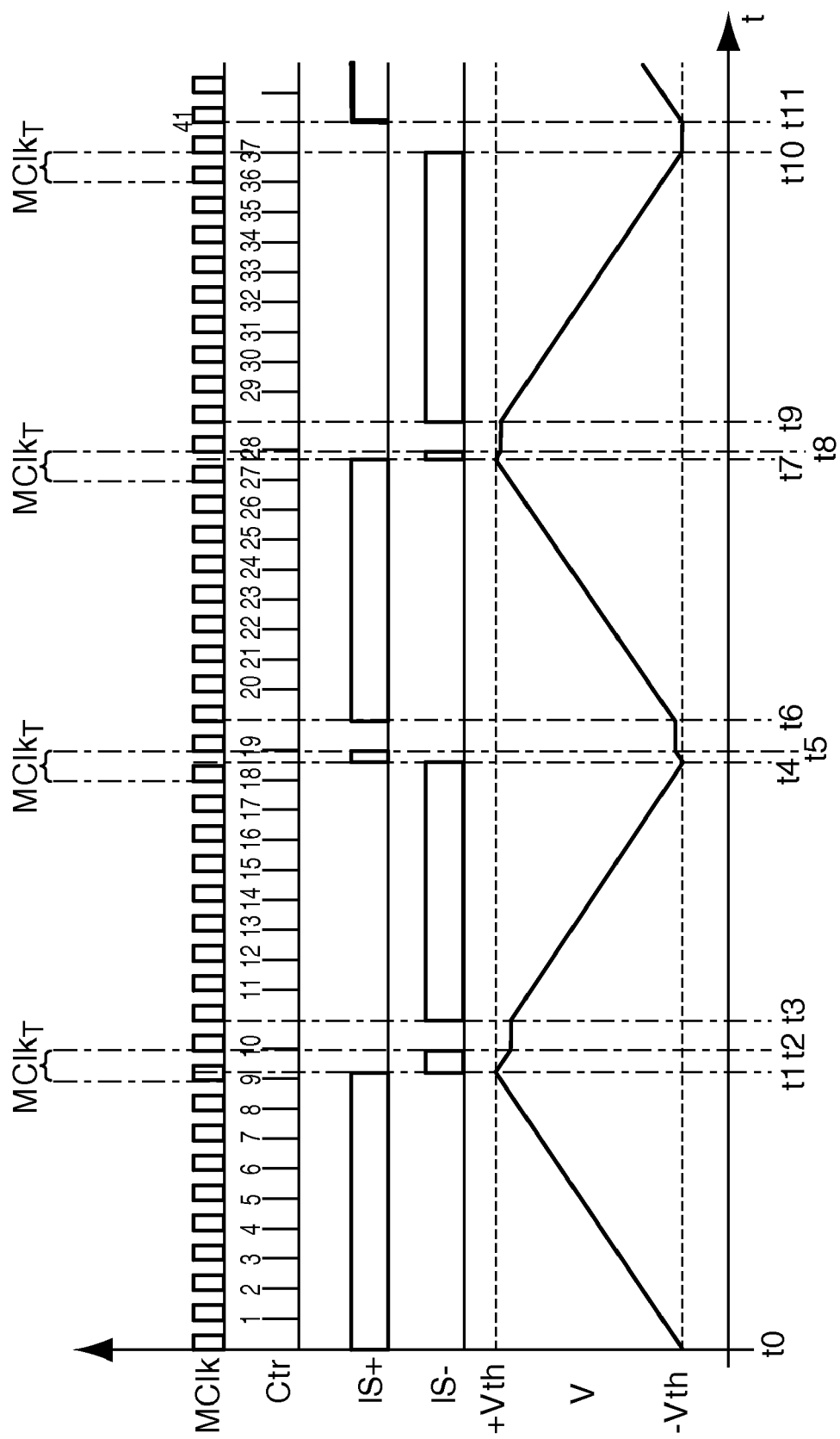
FIGS. 4A and 4B schematically show exemplary timing diagrams indicating operations of capacitance measurement circuits in accordance with certain embodiments of the present invention.

FIG. 4A indicates a time sequence for an example circuit operation. For simplicity, only a single voltage signal V is indicated, although in the general case multiple capacitances can be measured at the same time. The first ramp cycle begins at voltage level −Vth, and at the rising edge of an MClk cycle. This is designated time t0. In the case shown, a constant positive current (IS+) is applied until the high voltage threshold +Vth is reached at time t1. The MClk cycle during which +Vth is reached is designated at the terminal clock cycle, indicated by $MClk_T$. At time t1, the positive current IS+ is stopped, and the negative current IS− is injected for the remainder of $MClk_T$, which ends at time t2, resulting in a final voltage signal level somewhat below the high threshold +Vth. The ramp signal V is then held constant for a full clock cycle until the next ramp cycle begins at time t3. Holding the ramp signal constant for an extra clock cycle is not necessary, and done primarily for purposes of illustration. If multiple capacitances are being measured, however, it may be desirable to delay the initiation of subsequent ramp cycles until all signal ramps have reached the threshold level, for example to mitigate current flow through mutual capacitances between measurement locations, as described in above-referenced co-assigned U.S. Provisional Patent Application No. 61/017,451.

At time t3, the next ramp cycle begins at a voltage level below +Vth. The adjusted starting level accounts for the incremental amount of negative slope ramping performed between time t1 (when +Vth was reached) and time t2 (the end of the terminal clock cycle). This negative ramping "borrows" a fraction of a clock cycle from the second ramp cycle so that a whole number of MClk cycles can be accumulated during the first ramp cycle. In the case shown in FIG. 4A, ten MClk cycles are incremented, which includes the terminal clock cycle. Negative current IS− is injected beginning at time t3 to ramp the signal V back down to −Vth, which is reached at time t4. As before, the reverse current, in this case IS+, is injected for the remainder of the terminal clock cycle, which ends at time t5. The voltage level reached at time t5 becomes the starting point for the next signal ramp, which starts at time t6. Note that nine additional clock cycles are accumulated during the second ramp (including $MClk_T$), which results in a total of nineteen counts accumulated up until time t6.

At time t6, positive current IS+ is again injected until the high threshold +Vth is reached at time t7. Negative current IS− is then injected for the remainder of the terminal clock cycle, which ends at time t8, resulting in a final adjusted voltage level that is used as the starting position for the next ramp at time t9. At time t9, the final ramp occurs by injecting negative current IS− until the low threshold −Vth is reached at time t10. Note that, by happenstance, time t10 exactly coincides with the end of a clock cycle. By convention, the clock cycle that ends at time t10 is designated the terminal clock cycle, and is counted. After a one clock cycle hold, the integration period ends at time t11 after two up ramps and two down ramps. As indicated in FIG. 4A, the total number of clock cycles accumulated during ramping (not including hold times between ramps) equals thirty-seven, and the total time required to traverse the integration period is forty-one MClk cycles.

Reversing the signal ramp for the remainder of the clock cycle during which a threshold signal level has been reached, such as illustrated in FIG. 4A, has the effect of adjusting the starting point of the next ramp to compensate for the amount of time between when the threshold was reached and the next rising clock edge. As such, the full clock cycle during which the threshold was reached can be counted because the residual time is in effect subtracted from the next ramp cycle. By repeating the process over a number of ramp cycles, the cumulative sum of the residual times are accounted for so that the measurement resolution is on the order of a clock cycle time divided by the total measurement time (i.e., resolution can be enhanced using longer measurement periods) as opposed to being on the order of a clock cycle time divided by a single voltage ramp time (i.e., resolution is fixed regardless of measurement period).

Figure 4B:
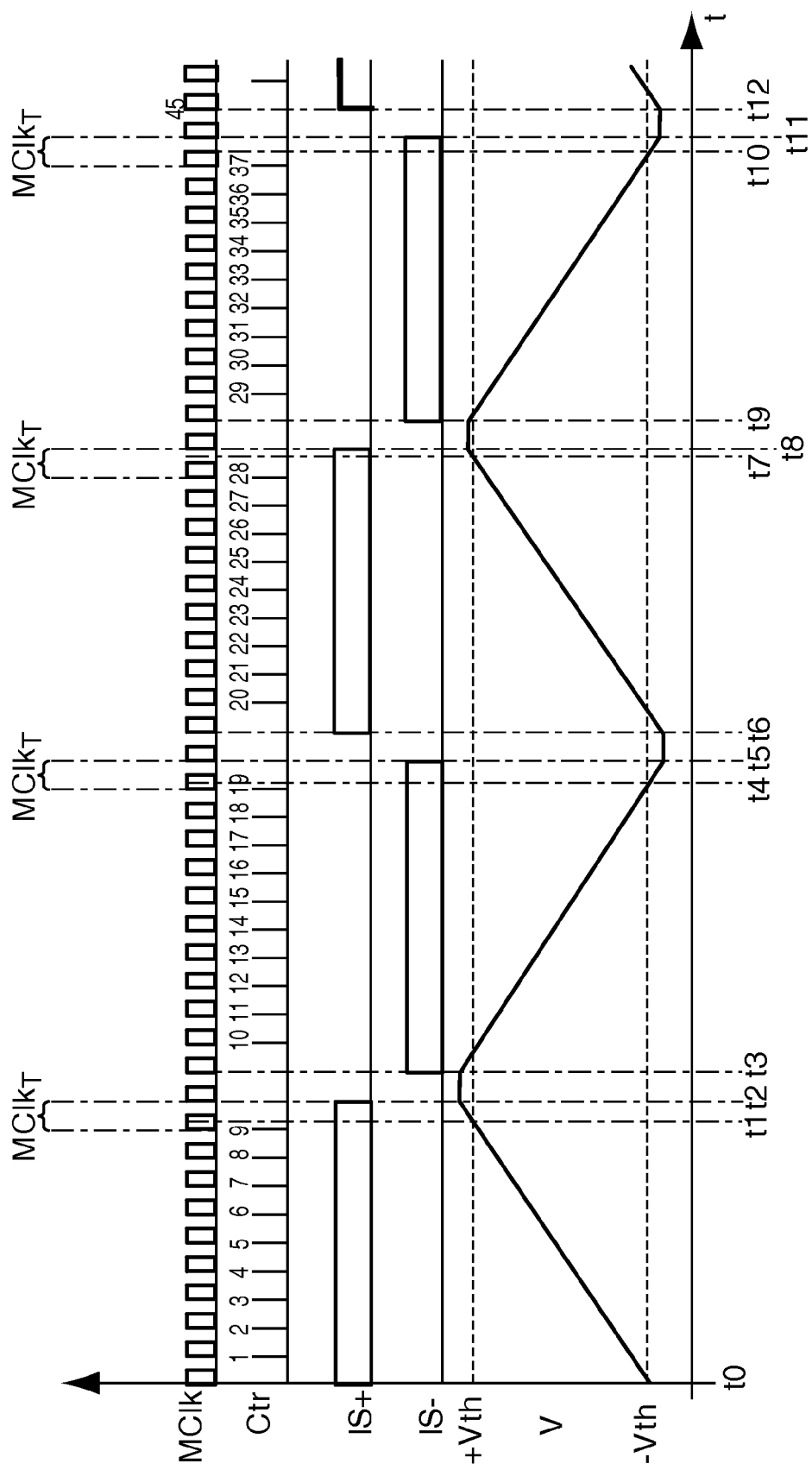

As illustrated in FIG. 4B, a similar effect can be achieved by allowing the signal ramps to overshoot the threshold values during the time between when the ramp reaches the threshold and the next rising clock edge. In this case, the next voltage ramp is initiated from the overshot voltage level, and therefore re-traverses the residual time period. In this case, the terminal MClk cycle is not counted in the previous ramp. This can result in an additional, uncounted MClk cycle between each ramp cycle.

FIG. 4B indicates an example circuit operation using the same clock period and signal slope as in FIG. 4A for ease of comparison. When signal V reaches threshold +Vth during the first ramp at time t1, the ramp continues past +Vth and stops at the end of the terminal clock cycle at time t2. This has the effect of adjusting the starting point of the subsequent ramp outside of the range −Vth to +Vth. When the next ramp starts at time t3, it first has to re-traverse the residual time period (equal to time t2 minus time t1), thereby carrying over the residual time from the first ramp to the next ramp. For this reason, the terminal clock cycle is not counted by the counter Ctr, resulting in a count of nine clock cycles at the end of the first ramp.

The next ramp is initiated at time t3 by injecting current IS−. At time t4, the low threshold −Vth is reached, and as such the current IS− is continued only for the remainder of the clock cycle $MClk_T$. At time t5, the terminal clock cycle ends, and the voltage signal is held at the resulting level below −Vth until the next clock cycle at time t6. Positive current IS+ is injected until the high threshold is reached at time t7, at which time IS+ is injected until time t8 when the terminal clock cycle ends. At time t9, the last ramp down is initiated from the adjusted voltage level. At time t10, the low voltage threshold is reached, and at time t11 the last terminal clock cycle ends. The integration period for measurement can be considered complete at time t12 after a total of forty-five completed MClk cycles, during which time thirty-seven clock cycles were accumulated by the counter Ctr. Note that the example shown in FIG. 4A also resulted in thirty-seven accumulated counts, but over a shorter integration period (forty-one MClk cycles).

Figure 4C:
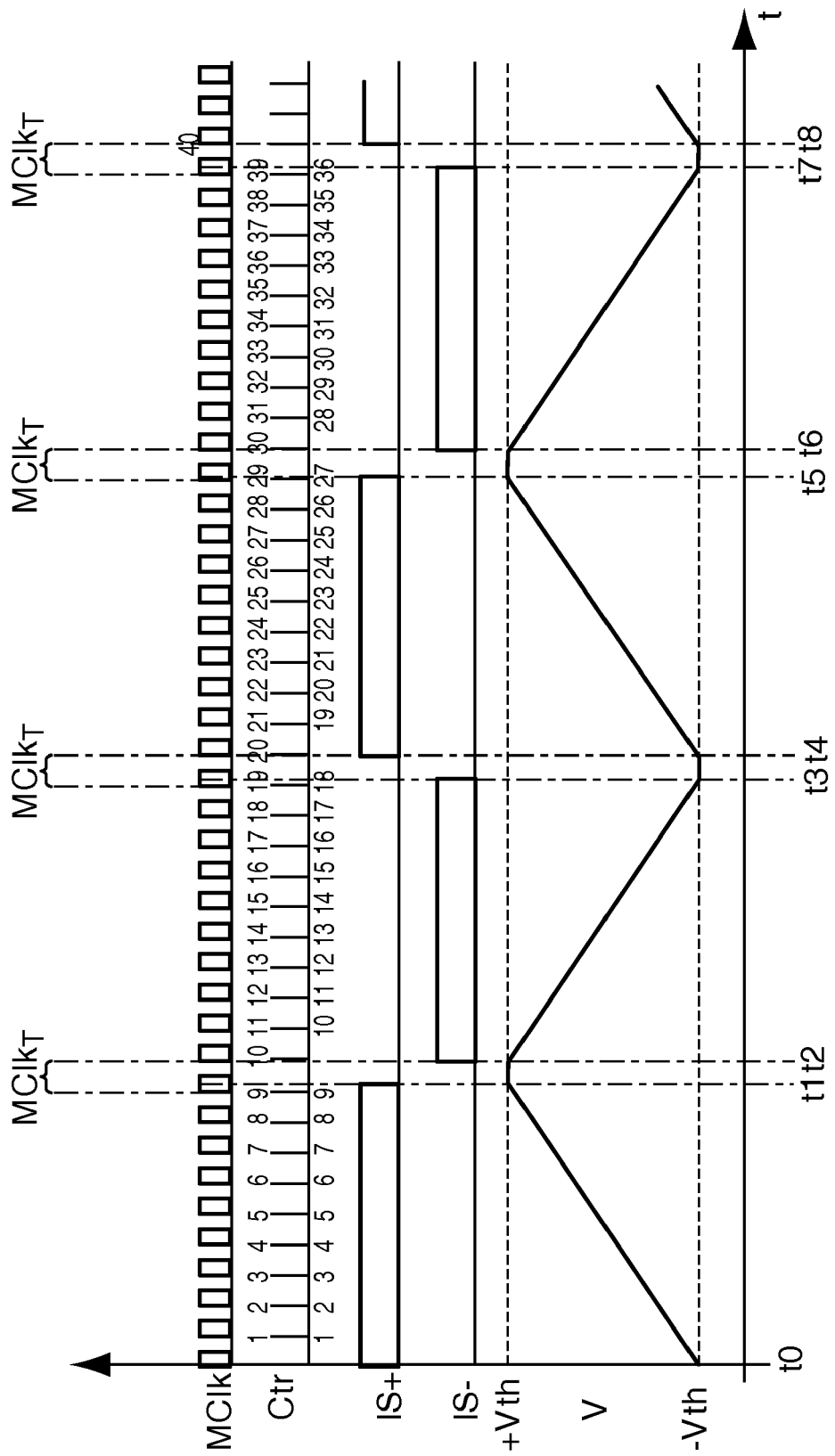
FIG. 4C schematically shows a timing diagram indicating operation of a comparison capacitance measurement circuit.

For comparison purposes, FIG. 4C indicates a time sequence for circuit operation without adjusting subsequent ramp starting levels to compensate for residual time. As such, the first ramp of FIG. 4C starts at time t0 and ends at time t1 when the threshold value +Vth is reached. The signal is held at +Vth until the next ramp is started at the next rising clock edge at time t2. The ramp down continues by injecting IS− until the low threshold −Vth is reached at time t3. The signal is held at −Vth until the next ramp is started at the next rising clock edge at time t4. The ramp up continues by injecting IS+ until the high threshold +Vth is reached at time t5. The signal is held at +Vth until the last down ramp is started at the next rising clock edge at time t6. The ramp down continues by injecting IS− until the low threshold −Vth is reached at time t7. The integration period ends at the end of the clock cycle at time t8. A total of forty clock cycles elapsed from time t0 to time t8, one fewer than for the signal operation shown in FIG. 4A. The total number of clock cycles accumulated during the ramping shown in FIG. 4C depends on whether the terminal clock cycles ($MClk_T$) are included. If the terminal clock cycles are counted, the accumulated counts in counter Ctr are thirty-nine, which is more than the thirty-seven counts shown to be accumulated in both FIGS. 4A and 4B. If the terminal clock cycles are not counted, the accumulated counts in counter Ctr are thirty-six, which is less than the thirty-seven counts shown to be accumulated in both FIGS. 4A and 4B. As such, comparison between FIG. 4C and FIGS. 4A and 4B indicates that over-counting or undercounting can result without adjusting subsequent ramp starting levels for the residual fractional clock cycles.

Figure 5:
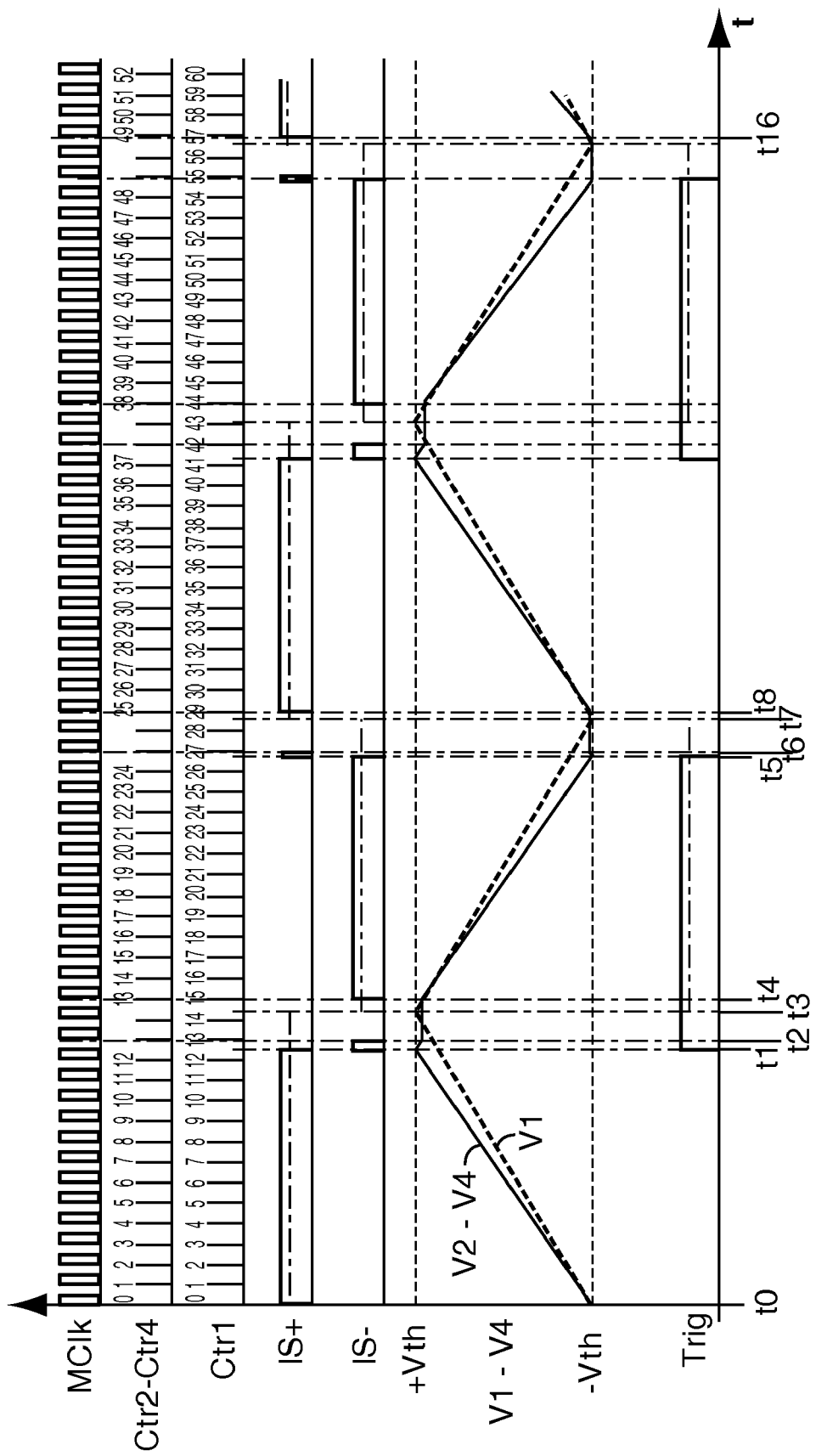
FIG. 5 schematically shows a timing diagram indicating operation of a multiple capacitance measurement circuit in accordance with certain embodiments of the present invention.

FIG. 5 indicates a time sequence for an example multiple capacitance circuit operation, for example the circuit shown in FIG. 3. FIG. 5 particularly illustrates a four location capacitance measurement (such as with a 4-wire analog capacitive touch sensor) where the capacitances to be measured are $C_x1$ through $C_x4$, with $C_x2$, $C_x3$, and $C_x4$ being equal and $C_x1$ being larger than $C_x2$, $C_x3$, and $C_x4$ (the ramps in FIG. 5 could represent, for example, $C_x1$ being about 15% larger). In reference to circuit shown in FIG. 3, FIG. 5 indicates ramping of signals V1 through V4 between thresholds −Vth and +Vth, when the comparator triggers Trig1 through Trig4 go high and low, when the IS+ and IS− currents are turned on and off, the accumulated counts in the counters Ctr1 and Ctr2 through Ctr4, and the main clock MClk cycles. Also indicated in FIG. 5 are various times t0 through t8 and t16 at which various events take place. It should be noted that dashed lines are generally used to represent parameters associated with timed-slope converter 61 (measurement channel 1), and unbroken lines are generally used to represent parameters associated the timed-slope converters 62 through 64 (measurement channels 2 through 4).

Because $C_x1$ is larger that the other capacitances, the voltage signal ramp of V1 lags behind the voltage signal ramps of V2 through V4. The main clock MClk frequency can be any suitable frequency that provides multiple clock cycles over an expected range of ramping times, for example the MClk frequency may be about 10 MHz to 30 MHz. The periods of the ramp signals V1 through V4 (i.e., one full ramp up, ramp down cycle) have frequencies controlled by the magnitudes of currents from sources IS+ and IS−, and the capacitances $C_x1$ through $C_x4$. In analog capacitive touch sensor examples, the frequencies of the voltage ramps might be in a range of about 20 KHz to about 200 KHz.

In exemplary embodiments, a measurement sequence starts on the rising edge of an MClk cycle, shown at t0 in FIG. 5. Four counters Ctr1 through Ctr4 increment counts at the end of each MClk cycle for each of the respective signals V1 through V4 as they ramp. The counter for each signal stops incrementing at the next rising edge of MClk that occurs after the respective signal reaches the voltage threshold (+Vth for forward ramps and −Vth for reverse ramps). For example, in FIG. 5, Ctr2 through Ctr4 stop at t2 with twelve increment counts. A stopped counter remains stopped until all the channels have reached the threshold. For example, at time t4 Ctr1 is stopped at an increment count of fourteen, and since all four channels have reached the voltage threshold by time t4, all counters Ctr1 through Ctr4 are re-started and all voltage signals V1 through V4 begin reverse ramps (note that Ctr1 is stopped and immediately re-started at t4).

In certain embodiments, when the voltage threshold is reached on a signal channel, the ramping reverses direction (independent of other ramps and independent of MClk). For example, when the +Vth threshold is reached at time t1 during a forward ramp of voltage signal V2, the output Trig2 of comparator A2 switches to high, turning off the IS2+ current source and simultaneously turning on the IS2− source. In FIG. 5, ramps V2 through V4 are shown to reverse at time t1, and ramp V1 is shown to reverse at time t3. Such ramp reversing terminates at the next rising edge of MClk, the same time that the respective measurement channel's counter is stopped (e.g., at time t2 for ramps V2 through V4, and a time t4 for ramp V1). The IS− source of the respective channel is turned off when its counter is stopped, resulting in a zero slope, and creating a delay as the channel waits for all the other channels to reach the threshold.

In FIG. 5, voltage signals V2 through V4 reverse at time t1 for the remainder of the MClk cycle, which ends at time t2. At time t2, the counters for signal channels V2 through V4 are stopped, and the signal ramps are held at zero slope (i.e., delayed). At time t3, signal V1 reaches it comparator A1's threshold (+Vth), and V1 reverses to a negative slope. By time t3, all the voltage signals have reached the threshold. Thus, in the embodiment shown in FIG. 5, all the voltage signals V1 through V4 are concurrently ramped down starting at time t4, which is the next rising edge of MClk. Note that due to signal adjustment via ramp reversal for the remainder of the MClk cycle in which a measurement channel reaches a voltage threshold, the subsequent ramp downs on the individual channels can be initiated from different starting voltages. In other words, each voltage signal ramp can be individually adjusted for respective residual times.

Continuing with the ramping cycles as shown in FIG. 5, each negative ramp stops when the −Vth threshold of its comparator is reached and the comparator output switches to low, turning off the IS− current source. As with the positive ramps, in certain embodiments the ramp can be reversed for the remainder of the MClk cycle during which the threshold was reached. For example, signal ramps V2 through V4 reverse at time t5, and signal ramp V1 reverses at time t7. After a channel reaches the threshold, its respective counter stops at the next rising edge of MClk. For example, Ctr2, Ctr3, and Ctr4 stop at time t6 with total accumulated increment counts of twenty-four. At time t7, voltage signal V1 reaches threshold −Vth. At time t8, the counter Ctr1 is stopped at an increment count of twenty-eight, but since all four comparators A1 through A4 have been triggered by time t8, all counters Ctr1 through Ctr4 are re-started and voltage signals V1 through V4 ramp positive together. In the example of FIG. 5, the integration period extends from time t0 to time t16, when all the channels have completed two full up and down voltage ramp cycles.

During the integration period, counter Ctr1 cumulatively increments fifty-six counts and counters Ctr2 through Ctr4 each cumulatively increment forty-eight counts. When the integration period is completed, an interrupt request (indicated by IRQ in FIG. 3, for example) is issued to a microprocessor, and the cumulative values held in the counters for each channel are transferred to the microprocessor. The cumulative number of counts for a channel relative to the other channels is proportionate to the capacitance of that channel relative to the others. In FIG. 5, counter Ctr1 has the highest number of cumulative counts, indicating that capacitance $C_x1$ has the largest magnitude. The ratios of the cumulative counts in one channel to the cumulative counts in the other channels indicate the ratios of the capacitances. In touch sensor embodiments, ratios of capacitances can be used to determine the touch location (calculations will depend on sensor configuration).

As indicated in FIG. 5, if a channel reaches the voltage signal threshold before one or more of the other channels, the voltage level of that channel is held near the threshold level until one or more of the other channels also reach the threshold. As such, rather than starting a subsequent immediately upon reaching the threshold, a delay is effected so that the subsequent ramp can be started concurrently on multiple channels. Effecting delays on one or more channels so that the next ramp can be initiated concurrently on multiple channels allows the ramp cycles of the channels to be approximately in phase. Keeping the ramp cycles approximately in phase (i.e., all positive ramps occurring during the same time frame, and all negative ramps occurring during the same time frame) can have the effect of mitigating inter-channel currents (i.e., currents flowing between capacitance measurement locations) by keeping any differences between the voltage signals on the various channels at any given time are relatively low. Reducing inter-channel currents can be particularly desirable when channels are connected to a 4-wire capacitive sensor where channels may be connected through a resistance. When individual channels are connected to electrodes in a matrix sensor, in-phase signal ramps may also be desired to minimize currents flowing through mutual capacitances of electrodes.

It will be appreciated that, although circuit operations are described and shown in FIGS. 4A, 4B and 5 in terms of bi-directional ramping (i.e., ramping up to a high threshold followed by ramping down to a low threshold), methods and circuits of the present invention can be implemented using unidirectional ramps such as used in the capacitance measurement circuits disclosed in U.S. Pat. No. 6,466,036, fully incorporated herein by reference. For example, in certain embodiments, the voltage signals are concurrently ramped up to a threshold, and after effecting a delay (e.g., to wait until all signal channel reach the threshold, to wait a predetermined amount of time, and so forth) the signal channels can be concurrently reset back to zero (e.g., in step function fashion) followed by re-starting the ramp ups. It will further be appreciated that, although circuit operations are described and shown in FIGS. 4A, 4B and 5 in terms of smooth ramping, for example due to application of a constant current, methods and circuits of the present invention can be implemented by applying a pulsed current or voltage, resulting in a stepped ramp. For example, U.S. Pat. No. 6,466,036 discloses a circuit that rapidly pulses current sources on and off to generate an incrementally stepped voltage ramp.

The level of current required to generate voltage signal ramps as illustrated in FIGS. 4A, 4B and 5 is dependent on the magnitudes of the capacitances to be measured as well as the ramp durations. For example, assuming a 4-wire capacitive touch sensor implementation operated as described with respect to FIG. 3 where Vcc=3V, the difference between thresholds +Vth and −Vth is 1V (e.g., +Vth at ⅔ Vcc and −Vth at ⅓ Vcc), and where the capacitances are on the order of 1000 pf, IS+ and IS− currents of 100 µA yield ramping periods of about 50 KHz. With reference to FIG. 2B, assuming Vcc=3V, a difference between thresholds +Vth and −Vth of 1V (e.g., +Vth at ⅔ Vcc and −Vth at ⅓ Vcc), and where the capacitances are on the order of 1000 pf, using a 15 KΩ resistor for R would source about 100 uA with an average voltage drop of 1.5V.

Random noise greater than the average voltage change during one MClk cycle generally has the effect of dithering the threshold levels, and as such the number of MClk cycles required to cross and re-cross a threshold can vary, even if the level of the capacitance being measured remains constant. Over many ramp cycles, the effects of random noise may mitigate the errors caused by terminating individual ramps without compensating for residual voltage from a previous ramp, as shown in FIG. 4C. A large number of measurement ramp cycles (i.e., over-sampling) can be used to average out the threshold dithering, resulting in increased measurement resolution. If sufficient noise is not present, other dithering methods may be employed to reach the same effect, for example thresholds can be varied randomly, or the frequency of MClk can be dithered randomly. In certain embodiments of the present invention, results from each ramp measurement can be added to or averaged with previous measurements, or can be filtered by methods such as boxcar filtering to yield updated values with increasing resolution as additional measurements are made.

Certain embodiments of the present invention measure elapsed voltage signal ramp times using accumulators. Accumulators can be used in the embodiments described above to measure time in a digital counter, in an analog integrator, or in a combination of both. Analog integrators start and stop quickly, thus being capable of measuring with high resolution. Digital counters have higher dynamic range, but temporal resolution may be limited by the clock frequency (e.g., MClk). Thus, in certain embodiments such as that shown in FIG. 4C, the circuit shown in FIG. 6 may be a desirable accumulator circuit.

Figure 6:
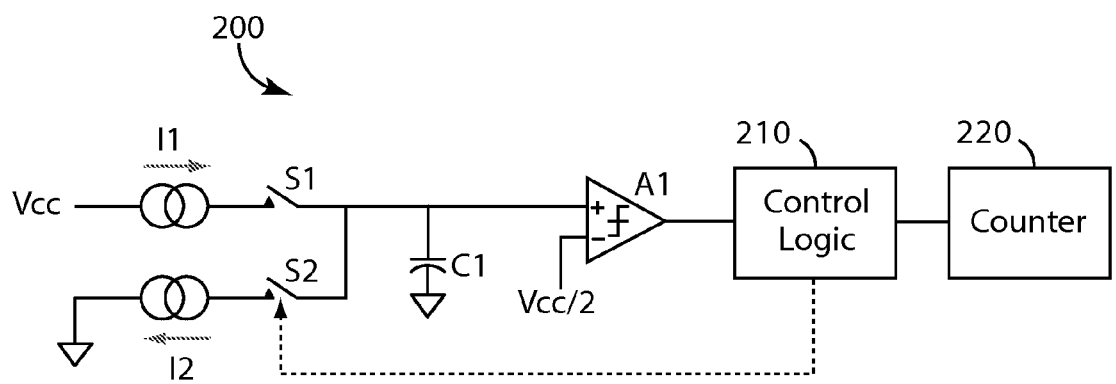
FIG. 6 schematically shows an exemplary accumulator circuit useful in certain embodiments of the present invention.

FIG. 6 shows an example of a sigma delta A-D converter 200 configured to measure time segments with high resolution. Capacitor C1 forms an analog integrator. A known reference current I1 feeds capacitor C1 when switch S1 is closed. Switch S1 is closed when the comparator trigger signals (e.g., +Trig and −Trig as in FIG. 3) are both high, that is when the voltage signal is ramping between low and high voltage thresholds. Sigma delta control logic 210 closes switch S2 for a fixed time when the input of A1 is above the Vcc/2 threshold, discharging integrator capacitor C1 incrementally. Each time switch S2 is closed, counter 220 is incremented. Counter 220 may be read periodically, and the incremental difference in counts between readings is proportionate to the total time that switch S1 is closed during the period.

As described in this document, current flow between capacitance measurement locations can be mitigated by controlling the phases of the drive signals. It will be appreciated that, for common capacitance-to-ground measurements systems such as the touch sensor systems shown in FIGS. 1A through 1C, driving the signals in phase can be used to desirably minimize mutual (inter-electrode) capacitance. In other systems, driving adjacent capacitance measurement locations out of phase can be used to enhance the measurement effect of inter-electrode mutual capacitance. For example, it can be desirable to measure, and therefore enhance, inter-electrode mutual capacitance in touch detection products that utilize shunt capacitance measurements, such as the AD7142, commercially available from Analog Devices, Inc. Phase control methods described herein may be used to adjust measurement channels to be in phase or out of phase.

The foregoing description of the various embodiments of the invention has been presented for the purposes of illustration and description. It is not intended to be exhaustive or to limit the invention to the precise form disclosed. Many modifications and variations are possible in light of the above teaching. For example, the detection methodologies described herein may be used in connection with a wide variety of touch implements, including tethered implements and implements that house a battery or other power source. It is intended that the scope of the invention be limited not by this detailed description, but rather by the claims appended hereto.

What is claimed is:

1. For use in a device for measuring capacitance provided at an electrode, relative to a reference node, by applying electrical charge to the electrode to ramp voltage signals between first and second reference voltage levels over multiple ramp cycles initiated in synchronization with clock cycles, the capacitance being proportionate to the cumulative whole number of clock cycles counted during voltage signal ramping over the multiple ramp cycles, a method comprising, upon reaching one of the reference voltages during a present ramp cycle at a time t1 during a terminal clock cycle:

relative to one of the first and second reference voltage levels, adjusting a starting voltage level for a subsequent ramp cycle by an amount to compensate for incremental voltage ramping that occurs from the time t1 to the end of the terminal clock cycle; and adjusting the number of clock cycles counted during the present ramp cycle depending on the adjusted starting voltage of the subsequent ramp cycle.

2. The method of claim 1, wherein adjusting the number of clock cycles counted comprises determining whether to count the terminal clock cycle.

3. The method of claim 2, wherein in response to adjusting the starting voltage level for the subsequent ramp cycle in a range between the first and second reference voltage levels, inclusive, the terminal clock cycle is counted.

4. The method of claim 2, wherein in response to adjusting the starting voltage level for the subsequent ramp cycle outside of a range between the first and second reference voltage levels, inclusive, the terminal clock cycle is not counted.

5. The method of claim 1, wherein after starting the subsequent ramp cycle the method further comprises designating the subsequent ramp cycle as the present ramp cycle, and repeating the recited steps.

6. The method of claim 1, wherein the multiple ramp cycles alternately ramp from the first reference voltage to the second reference voltage, and then from the second reference voltage to the first reference voltage.

7. The method of claim 1, wherein each of the multiple ramp cycles ramp from the first reference voltage to the second reference voltage.

8. The method of claim 1, wherein applying electrical charge to the electrode comprises applying a continuous current.

9. The method of claim 1, wherein applying electrical charge to the electrode comprises applying a pulsed current.

10. The method of claim 1, wherein applying electrical charge to the electrode comprises applying a voltage through an impedance.

11. The method of claim 1, wherein the electrode forms at least part of a touch surface of a touch sensitive device, and the capacitance results from a touch to the touch surface.

12. The method of claim 11, wherein the touch sensitive device comprises a capacitive button sensor.

13. The method of claim 11, wherein the touch sensitive device comprises an analog capacitive touch surface.

14. The method of claim 13, further comprising performing the recited steps at a plurality of locations on the electrode so that capacitance of the electrode can be measured at each of the locations.

15. The method of claim 14, further comprising using the capacitance of the electrode measured at each of the locations to determine position of the touch on the touch surface.

16. The method of claim 11, wherein the touch sensitive device comprises a matrix capacitive touch surface, and the electrode comprises one of a plurality of electrodes arranged in a matrix.

17. The method of claim 16, further comprising performing the recited steps for each of the plurality of electrodes.

18. The method of claim 1, wherein adjusting a starting voltage level for a subsequent ramp cycle comprises reversing the present ramp during the time from t1 to the end of the terminal clock cycle.

19. The method of claim 1, wherein adjusting a starting voltage level for a subsequent ramp cycle comprises continuing the present ramp past during the time from t1 to the end of the terminal clock cycle.

20. A device that measures capacitance provided at an electrode, relative to a reference node, by applying electrical charge to the electrode to ramp voltage signals between first and second reference voltage levels over multiple ramp cycles initiated in synchronization with clock cycles, the capacitance being proportionate to the cumulative whole number of clock cycles counted during voltage signal ramping over the multiple ramp cycles, the device comprising:

a ramp control circuit that, responsive to reaching one of the reference voltages during a present ramp cycle at a time t1 during a terminal clock cycle, adjusts a starting voltage level for a subsequent ramp cycle relative to one of the first and second reference voltage levels by an amount that compensates for incremental voltage ramping that occurs during the present ramp cycle from the time t1 to the end of the terminal clock cycle; and a counter control circuit that adjusts the number of clock cycles counted during the present ramp cycle depending on the adjusted starting voltage of the subsequent ramp cycle.

21. The device of claim 20, wherein the electrode forms at least part of a touch surface of a touch sensitive device, and the capacitance results from a touch to the touch surface.

22. The device of claim 21, wherein the touch sensitive device comprises a capacitive button sensor.

23. The device of claim 21, wherein the touch sensitive device comprises an analog capacitive touch surface.

24. The device of claim 21, wherein the touch sensitive device comprises a matrix capacitive touch surface, and the electrode comprises one of a plurality of electrodes arranged in a matrix.

25. A device that measures capacitance at a plurality of locations, relative to a reference node, by applying electrical charge to each location to ramp respective voltage signals between first and second reference voltage levels over multiple ramp cycles initiated in synchronization with clock cycles, the capacitance at each location being proportionate to the cumulative whole number of clock cycles counted during respective voltage signal ramping over the multiple ramp cycles, the device comprising:

a ramp control circuit associated with each of the plurality of locations to control ramping of the respective voltage signal, each ramp control circuit operable to adjust a starting voltage level for a subsequent ramp cycle of the respective voltage signal relative to one of the first and second reference voltage levels by an amount that compensates for incremental voltage ramping of the respective voltage signal during a terminal clock cycle of a previous ramp cycle; and a counter control circuit that adjusts the number of clock cycles counted during the previous ramp cycle depending on the adjusted starting voltage of the subsequent ramp cycle.

26. For use in a device for measuring capacitance provided at an electrode, relative to a reference node, by applying electrical charge to the electrode to ramp a voltage signal between first and second reference voltage levels over multiple ramp cycles initiated in synchronization with clock cycles, the capacitance being proportionate to the cumulative whole number of clock cycles counted during voltage signal ramping over the multiple ramp cycles, a method for increasing capacitance measurement resolution comprising:

adjusting a starting voltage level for a subsequent voltage signal ramp cycle relative to one of the first and second reference voltage levels by an amount that compensates for incremental voltage ramping during a terminal clock cycle of a previous voltage signal ramp cycle; adjusting the number of clock cycles counted during the previous ramp cycle depending on the adjusted starting voltage of the subsequent ramp cycle.

* * * * *